(12) United States Patent
Daley

(10) Patent No.: US 7,269,044 B2
(45) Date of Patent: Sep. 11, 2007

(54) METHOD AND APPARATUS FOR ACCESSING A MEMORY ARRAY

(75) Inventor: Jon Daley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 28 days.

(21) Appl. No.: 11/111,838

(22) Filed: Apr. 22, 2005

(65) Prior Publication Data
US 2006/0239058 A1    Oct. 26, 2006

(51) Int. Cl.
*G11C 5/06* (2006.01)
(52) U.S. Cl. .................................. 365/63; 365/148
(58) Field of Classification Search ............... 365/63, 365/148
See application file for complete search history.

(56) References Cited

U.S. PATENT DOCUMENTS

| | | |
|---|---|---|
| 3,271,591 A | 9/1966 | Ovshinsky |
| 3,622,319 A | 11/1971 | Sharp |
| 3,743,847 A | 7/1973 | Boland |
| 3,961,314 A | 6/1976 | Klose et al. |
| 3,966,317 A | 6/1976 | Wacks et al. |
| 3,983,542 A | 9/1976 | Ovshinsky |
| 3,988,720 A | 10/1976 | Ovshinsky |
| 4,177,474 A | 12/1979 | Ovshinsky |
| 4,267,261 A | 5/1981 | Hallman et al. |
| 4,269,935 A | 5/1981 | Masters et al. |
| 4,312,938 A | 1/1982 | Drexler et al. |
| 4,316,946 A | 2/1982 | Masters et al. |
| 4,320,191 A | 3/1982 | Yoshikawa et al. |
| 4,405,710 A | 9/1983 | Balasubramanyam et al. |
| 4,419,421 A | 12/1983 | Wichelhaus et al. |
| 4,499,557 A | 2/1985 | Holmberg et al. |
| 4,597,162 A | 7/1986 | Johnson et al. |
| 4,608,296 A | 8/1986 | Keem et al. |
| 4,637,895 A | 1/1987 | Ovshinsky et al. |
| 4,646,266 A | 2/1987 | Ovshinsky et al. |
| 4,664,939 A | 5/1987 | Ovshinsky |
| 4,668,968 A | 5/1987 | Ovshinsky et al. |
| 4,670,763 A | 6/1987 | Ovshinsky et al. |

(Continued)

FOREIGN PATENT DOCUMENTS

JP        5-6126915        10/1981

(Continued)

OTHER PUBLICATIONS

Abdel-All, A.; Elshafie,A.; Elhawary, M.M., DC Electric-field Effect in Bulk and Thin-film Ge5As38Te57 Chalcogenide Glass, Vacuum 59 (2000) 845-853.

(Continued)

*Primary Examiner*—Hoai V. Ho
(74) *Attorney, Agent, or Firm*—Dickstein Shapiro LLP

(57) ABSTRACT

A memory device including first and second memory elements is provided. The first and second memory elements each have first and second electrodes. The first electrode of the first and second memory elements is a common first electrode and is located below the second electrodes. A first line is connected to the second electrode of the first memory element and a second line connected to the second electrode of the second memory element. The first and second lines are switchably connected to a third line for applying a voltage to the second electrodes. Methods of operating a memory device are also provided.

38 Claims, 5 Drawing Sheets

U.S. PATENT DOCUMENTS

| | | | |
|---|---|---|---|
| 4,671,618 A | 6/1987 | Wu et al. |
| 4,673,957 A | 6/1987 | Ovshinsky et al. |
| 4,678,679 A | 7/1987 | Ovshinsky |
| 4,696,758 A | 9/1987 | Ovshinsky et al. |
| 4,698,234 A | 10/1987 | Ovshinsky et al. |
| 4,710,899 A | 12/1987 | Young et al. |
| 4,728,406 A | 3/1988 | Banerjee et al. |
| 4,737,379 A | 4/1988 | Hudgens et al. |
| 4,766,471 A | 8/1988 | Ovshinsky et al. |
| 4,769,338 A | 9/1988 | Ovshinsky et al. |
| 4,775,425 A | 10/1988 | Guha et al. |
| 4,788,594 A | 11/1988 | Ovshinsky et al. |
| 4,795,657 A | 1/1989 | Formigoni et al. |
| 4,800,526 A | 1/1989 | Lewis |
| 4,809,044 A | 2/1989 | Pryor et al. |
| 4,818,717 A | 4/1989 | Johnson et al. |
| 4,843,443 A | 6/1989 | Ovshinsky et al. |
| 4,845,533 A | 7/1989 | Pryor et al. |
| 4,847,674 A | 7/1989 | Sliwa et al. |
| 4,853,785 A | 8/1989 | Ovshinsky et al. |
| 4,891,330 A | 1/1990 | Guha et al. |
| 5,128,099 A | 7/1992 | Strand et al. |
| 5,159,661 A | 10/1992 | Ovshinsky et al. |
| 5,166,758 A | 11/1992 | Ovshinsky et al. |
| 5,177,567 A | 1/1993 | Klersy et al. |
| 5,219,788 A | 6/1993 | Abernathey et al. |
| 5,238,862 A | 8/1993 | Blalock et al. |
| 5,272,359 A | 12/1993 | Nagasubramanian et al. |
| 5,296,716 A | 3/1994 | Ovshinsky et al. |
| 5,314,772 A | 5/1994 | Kozicki |
| 5,315,131 A | 5/1994 | Kishimoto et al. |
| 5,335,219 A | 8/1994 | Ovshinsky et al. |
| 5,341,328 A | 8/1994 | Ovshinsky et al. |
| 5,350,484 A | 9/1994 | Gardner et al. |
| 5,359,205 A | 10/1994 | Ovshinsky |
| 5,360,981 A | 11/1994 | Owen et al. |
| 5,406,509 A | 4/1995 | Ovshinsky et al. |
| 5,414,271 A | 5/1995 | Ovshinsky et al. |
| 5,500,532 A | 3/1996 | Kozicki |
| 5,512,328 A | 4/1996 | Yoshimura et al. |
| 5,512,773 A | 4/1996 | Wolf et al. |
| 5,534,711 A | 7/1996 | Ovshinsky et al. |
| 5,534,712 A | 7/1996 | Ovshinsky et al. |
| 5,536,947 A | 7/1996 | Klersy et al. |
| 5,543,737 A | 8/1996 | Ovshinsky |
| 5,591,501 A | 1/1997 | Ovshinsky et al. |
| 5,596,522 A | 1/1997 | Ovshinsky et al. |
| 5,687,112 A | 11/1997 | Ovshinsky |
| 5,694,054 A | 12/1997 | Ovshinsky et al. |
| 5,714,768 A | 2/1998 | Ovshinsky et al. |
| 5,726,083 A | 3/1998 | Takaishi |
| 5,751,012 A | 5/1998 | Wolstenholme et al. |
| 5,761,115 A | 6/1998 | Kozicki et al. |
| 5,789,277 A | 8/1998 | Zahorik et al. |
| 5,814,527 A | 9/1998 | Wolstenholme et al. |
| 5,818,749 A | 10/1998 | Harshfield |
| 5,825,046 A | 10/1998 | Czubatyj et al. |
| 5,841,150 A | 11/1998 | Gonzalez et al. |
| 5,846,889 A | 12/1998 | Harbison et al. |
| 5,851,882 A | 12/1998 | Harshfield |
| 5,869,843 A | 2/1999 | Harshfield |
| 5,896,312 A | 4/1999 | Kozicki et al. |
| 5,912,839 A | 6/1999 | Ovshinsky et al. |
| 5,914,893 A | 6/1999 | Kozicki et al. |
| 5,920,788 A | 7/1999 | Reinberg |
| 5,933,365 A | 8/1999 | Klersy et al. |
| 5,998,066 A | 12/1999 | Block et al. |
| 6,011,757 A | 1/2000 | Ovshinsky |
| 6,031,287 A | 2/2000 | Harshfield |
| 6,072,716 A | 6/2000 | Jacobson et al. |
| 6,077,729 A | 6/2000 | Harshfield |
| 6,084,796 A | 7/2000 | Kozicki et al. |
| 6,087,674 A | 7/2000 | Ovshinsky et al. |
| 6,117,720 A | 9/2000 | Harshfield |
| 6,141,241 A | 10/2000 | Ovshinsky et al. |
| 6,143,604 A | 11/2000 | Chiang et al. |
| 6,177,338 B1 | 1/2001 | Liaw et al. |
| 6,205,073 B1 * | 3/2001 | Naji ........................... 365/209 |
| 6,236,059 B1 | 5/2001 | Wolstenholme et al. |
| RE37,259 E | 7/2001 | Ovshinsky |
| 6,297,170 B1 | 10/2001 | Gabriel et al. |
| 6,300,684 B1 | 10/2001 | Gonzalez et al. |
| 6,316,784 B1 | 11/2001 | Zahorik et al. |
| 6,329,606 B1 | 12/2001 | Freyman et al. |
| 6,339,544 B1 | 1/2002 | Chiang et al. |
| 6,348,365 B1 | 2/2002 | Moore et al. |
| 6,350,679 B1 | 2/2002 | McDaniel et al. |
| 6,376,284 B1 | 4/2002 | Gonzalez et al. |
| 6,388,324 B2 | 5/2002 | Kozicki |
| 6,391,688 B1 | 5/2002 | Gonzalez et al. |
| 6,404,665 B1 | 6/2002 | Lowrey et al. |
| 6,414,376 B1 | 7/2002 | Thakur et al. |
| 6,418,049 B1 | 7/2002 | Kozicki et al. |
| 6,420,725 B1 | 7/2002 | Harshfield |
| 6,423,628 B1 | 7/2002 | Li et al. |
| 6,429,064 B1 | 8/2002 | Wicker |
| 6,437,383 B1 | 8/2002 | Xu |
| 6,440,837 B1 | 8/2002 | Harshfield |
| 6,462,984 B1 | 10/2002 | Xu et al. |
| 6,469,364 B1 | 10/2002 | Kozicki |
| 6,473,332 B1 | 10/2002 | Ignatiev et al. |
| 6,480,438 B1 | 11/2002 | Park |
| 6,487,106 B1 | 11/2002 | Kozicki |
| 6,487,113 B1 | 11/2002 | Park et al. |
| 6,501,111 B1 | 12/2002 | Lowrey |
| 6,507,061 B1 | 1/2003 | Hudgens et al. |
| 6,511,862 B2 | 1/2003 | Hudgens et al. |
| 6,511,867 B2 | 1/2003 | Lowrey et al. |
| 6,512,241 B1 | 1/2003 | Lai |
| 6,514,805 B2 | 2/2003 | Xu et al. |
| 6,531,373 B2 | 3/2003 | Gill et al. |
| 6,534,781 B2 | 3/2003 | Dennison |
| 6,545,287 B2 | 4/2003 | Chiang |
| 6,545,907 B1 | 4/2003 | Lowrey et al. |
| 6,555,860 B2 | 4/2003 | Lowrey et al. |
| 6,563,164 B2 | 5/2003 | Lowrey et al. |
| 6,566,700 B2 | 5/2003 | Xu |
| 6,567,293 B1 | 5/2003 | Lowrey et al. |
| 6,569,705 B2 | 5/2003 | Chiang et al. |
| 6,570,784 B2 | 5/2003 | Lowrey |
| 6,576,921 B2 | 6/2003 | Lowrey |
| 6,586,761 B2 | 7/2003 | Lowrey |
| 6,589,714 B2 | 7/2003 | Maimon et al. |
| 6,590,707 B1 | 7/2003 | Weber |
| 6,593,176 B2 | 7/2003 | Dennison |
| 6,597,009 B2 | 7/2003 | Wicker |
| 6,605,527 B2 | 8/2003 | Dennison et al. |
| 6,613,604 B2 | 9/2003 | Maimon et al. |
| 6,621,095 B2 | 9/2003 | Chiang et al. |
| 6,625,054 B2 | 9/2003 | Lowrey et al. |
| 6,642,102 B2 | 11/2003 | Xu |
| 6,646,297 B2 | 11/2003 | Dennison |
| 6,649,928 B2 | 11/2003 | Dennison |
| 6,667,900 B2 | 12/2003 | Lowrey et al. |
| 6,671,710 B2 | 12/2003 | Ovshinsky et al. |
| 6,673,648 B2 | 1/2004 | Lowrey |
| 6,673,700 B2 | 1/2004 | Dennison et al. |
| 6,674,115 B2 | 1/2004 | Hudgens et al. |
| 6,687,153 B2 | 2/2004 | Lowrey |
| 6,687,427 B2 | 2/2004 | Ramalingam et al. |
| 6,690,026 B2 | 2/2004 | Peterson |
| 6,696,355 B2 | 2/2004 | Dennison |
| 6,707,712 B2 | 3/2004 | Lowery |
| 6,714,954 B2 | 3/2004 | Ovshinsky et al. |

| | | | |
|---|---|---|---|
| 6,826,076 B2* | 11/2004 | Asano et al. | 365/158 |
| 6,937,505 B2* | 8/2005 | Morikawa | 365/158 |
| 7,016,222 B2* | 3/2006 | Morikawa | 365/158 |
| 7,064,970 B2* | 6/2006 | Nazarian | 365/46 |
| 2002/0000666 A1 | 1/2002 | Kozicki et al. | |
| 2002/0072188 A1 | 6/2002 | Gilton | |
| 2002/0106849 A1 | 8/2002 | Moore | |
| 2002/0123169 A1 | 9/2002 | Moore et al. | |
| 2002/0123170 A1 | 9/2002 | Moore et al. | |
| 2002/0123248 A1 | 9/2002 | Moore et al. | |
| 2002/0127886 A1 | 9/2002 | Moore et al. | |
| 2002/0132417 A1 | 9/2002 | Li | |
| 2002/0160551 A1 | 10/2002 | Harshfield | |
| 2002/0163828 A1 | 11/2002 | Krieger et al. | |
| 2002/0168820 A1 | 11/2002 | Kozicki | |
| 2002/0168852 A1 | 11/2002 | Kozicki | |
| 2002/0190289 A1 | 12/2002 | Harshfield et al. | |
| 2002/0190350 A1 | 12/2002 | Kozicki et al. | |
| 2003/0001229 A1 | 1/2003 | Moore et al. | |
| 2003/0027416 A1 | 2/2003 | Moore | |
| 2003/0032254 A1 | 2/2003 | Gilton | |
| 2003/0035314 A1 | 2/2003 | Kozicki | |
| 2003/0035315 A1 | 2/2003 | Kozicki | |
| 2003/0038301 A1 | 2/2003 | Moore | |
| 2003/0043631 A1 | 3/2003 | Gilton et al. | |
| 2003/0045049 A1 | 3/2003 | Campbell et al. | |
| 2003/0045054 A1 | 3/2003 | Campbell et al. | |
| 2003/0047765 A1 | 3/2003 | Campbell | |
| 2003/0047772 A1 | 3/2003 | Li | |
| 2003/0047773 A1 | 3/2003 | Li | |
| 2003/0048519 A1 | 3/2003 | Kozicki | |
| 2003/0048744 A1 | 3/2003 | Ovshinsky et al. | |
| 2003/0049912 A1 | 3/2003 | Campbell et al. | |
| 2003/0068861 A1 | 4/2003 | Li et al. | |
| 2003/0068862 A1 | 4/2003 | Li et al. | |
| 2003/0095426 A1 | 5/2003 | Hush et al. | |
| 2003/0096497 A1 | 5/2003 | Moore et al. | |
| 2003/0107105 A1 | 6/2003 | Kozicki | |
| 2003/0117831 A1 | 6/2003 | Hush | |
| 2003/0128612 A1 | 7/2003 | Moore et al. | |
| 2003/0137869 A1 | 7/2003 | Kozicki | |
| 2003/0143782 A1 | 7/2003 | Gilton et al. | |
| 2003/0155589 A1 | 8/2003 | Campbell et al. | |
| 2003/0155606 A1 | 8/2003 | Campbell et al. | |
| 2003/0156447 A1 | 8/2003 | Kozicki | |
| 2003/0156463 A1 | 8/2003 | Casper et al. | |
| 2003/0209728 A1 | 11/2003 | Kozicki et al. | |
| 2003/0209971 A1 | 11/2003 | Kozicki et al. | |
| 2003/0210564 A1 | 11/2003 | Kozicki et al. | |
| 2003/0212724 A1 | 11/2003 | Ovshinsky et al. | |
| 2003/0212725 A1 | 11/2003 | Ovshinsky et al. | |
| 2004/0035401 A1 | 2/2004 | Ramachandran et al. | |

FOREIGN PATENT DOCUMENTS

| | | |
|---|---|---|
| WO | WO97/48032 | 12/1997 |
| WO | WO99/28914 | 6/1999 |
| WO | WO 00/48196 | 8/2000 |
| WO | WO 02/21542 | 3/2002 |

OTHER PUBLICATIONS

Adler, D.; Moss, S.C., Amorphous Memories and Bistable Switches, J. Vac. Sci. Technol. 9 (1972) 1182-1189.

Adler, D.; Henisch, H.K.; Mott, S.N., The Mechanism of Threshold Switching in Amorphous Alloys, Rev. Mod. Phys. 50 (1978) 209-220.

Afifi, M.A.; Labib, H.H.; El-Fazary, M.H.; Fadel, M., Electrical and Thermal Properties of Chalcogenide Glass System Se75Ge25-xSbx, Appl. Phys. A 55 (1992) 167-169.

Afifi,M.A.; Labib, H.H.; Fouad, S.S.; El-Shazly, A.A., Electrical & Thermal Conductivity of the Amorphous Semiconductor GexSe1-x, Egypt, J. Phys. 17 (1986) 335-342.

Alekperova, Sh.M.: Gadzhieva, G.S., Current-voltage Characteristics of Ag2Se Single Crystal Near the Phase Transition, Inorganic Materials 23 (1987) 137-139.

Aleksiejunas, A.; Cesnys, A., Switching Phenomenon and Memory Effect in Thin-film Heterojunction of Polycrystalline Selenium-silver Selenide, Phys. Stat. Sol. (a) 19 (1973) K169-K171.

Angell, C.A., Mobile Ions in Amorphous Solids, Annu. Rev. Phys. Chem. 43 (1992) 693-717.

Aniya, M., Average Electronegativity, Medium-range-order, and Ionic Conductivity in Superionic Glasses, Solid State Ionics 136-137 (2000) 1085-1089.

Asahara, Y.; Izumitani, T., Voltage Controlled Switching in Cu-As-Se Compositions, J. Non-Cryst. Solids 11 (1972) 97-104.

Asokan, S.; Prasad, M.V.N.; Parthasarathy, G.; Gopal, E.S.R., Mechanical and Chemical Thresholds in IV-VI Chalcogenide Glasses, Phys. Rev. Lett. 62 (1989) 808-810.

Axon Technologies Corporation, Technology Description: *Programmable Metalization Cell (PMC)*, pp. 1-6 (pre-May 2000).

Baranovskii, S.D.; Cordes, H., On the Conduction Mechanism in Ionic glasses, J. Chem. Phys. 111 (1999) 7546-7557.

Belin, R.; Taillades, G.; Pradel, A.; Ribes, M., Ion Dynamics in Superionic Chalcogenide Glasses: CompleteConductivity Spectra, Solid State Ionics 136-137 (2000) 1025-1029.

Belin, R.; Zerouale, A.; Pradel, A.; Ribes, M., Ion Dynamics in the Argyrodite Compound Ag7GeSe51: Non-Arrhenius Behavior and Complete Conductivity Spectra, Solid State Ionics 143 (2001) 445-455.

Benmore, C.J.; Salmon, P.S., Structure of Fast Ion Conducting and Semiconducting Glassy Chalcogenide Alloys, Phys. Rev. Lett. 73 (1994) 264-267.

Bernede, J.C., Influence Du Metal Des Electrodes Sur Les caracteristiques Courant-tension Des Structures M-Ag2Se-M, Thin Solid Films 70 (1980) L1-L4.

Bernede, J.C., Polarized Memory Switching in MIS Thin Films, Thin Solid Films 81 (1981) 155-160.

Bernede, J.C., Switching and Silver Movements in Ag2Se Thin Films, Phys. Stat. Sol. (a) 57 (1980) K101-K104.

Bernede, J.C.; Abachi, T., Differential Negative Resistance in Metal/insulator/metal Structures with an Upper Bilayer Electrode, Thin Solid Films 131 (1985) L61-L64.

Bernede, J.C.:; Conan, A.; Fousenan't, E.; El Bouchairi, B.; Goureaux, G., Polarized Memory Switching Effects in Ag2Se/Se/M Thin Film Sandwiches, Thin Solid Films 97 (1982) 165-171.

Bernede, J.C., Khelil, A.; Kettaf, M.; Conan, A., Transition from S- to N-type Differential Negative Resistance in Al-Al2O3-Ag2-xSe1+x Thin Film Structures, Phys. Stat. Sol. (a) 74 (1982) 217-224.

Bondarev, V.N.; Pikhitsa, P.V., A Dendrite Model of Current Instability in RbAg4I5, Solid State Ionics 70/71 (1994) 72-76.

Boolchand, P., The Maximum in Glass Transition Temperature (Tg) Near x=1/3 in GexSe1-x Glasses, Asian Journal of Physics (2000) 9, 709-72.

Boolchand, P.; Bresser, W.J., Mobile Silver Ions and Glass Formation in Solid Electrolytes, Nature 410 (2001) 1070-1073.

Boolchand, P.; Georgiev, D.G.; Goodman, B., Discovery of the Intermediate Phase in Chalcogenide Glasses, J. Optoelectronics and Advanced Materials, 3 (2001), 703.

Boolchand, P.; Selvanathan, D.; Wang, Y.; Georgiev, D.G.; Bresser, W.J., Onset of Rigidity in Steps in Chalcogenide Glasses, Properties and Applications of Amorphous Materials, M.F. Thorpe and Tichy, L. (eds.) Kluwer Academic Publishers, the Netherlands, 2001, pp. 97-132.

Boolchand, P.; Enzweiler, R.N.; Tenhover, M., Structural Ordering of Evaporated Amorphous Chalcogenide Alloy Ffilms: Role of Thermal Annealing, Diffusion and Defect Data vol. 53-54 (1987) 415-420.

Boolchand, P.; Grothaus, J.; Bresser, W.J.; Suranyi, P., Structural Origin of Broken Chemical Order in a GeSe2 glass, Phys. Rev. B 25 (1982) 2975-2978.

Boolchand, P.; Grothaus, J.; Phillips, J.C., Broken Chemical Order and Phase Separation in GexSe1-x Glasses, Solid State Comm. 45 (1983) 183-185.

Boolchand, P., Bresser, W.J., Compositional Trends in Glass Transition Temperature (Tg), Network Connectivity and Nanoscale Chemical Phase Separation in Chalcogenides, Dept. of ECECS, Univ. Cincinnati (Oct. 28, 1999) 45221-0030.

Boolchand, P.; Grothaus, J, Molecular Structure of Melt-Quenched GeSe2 and GeS2 Glasses Compared, Proc. Int. Conf. Phys. Semicond. (Eds. Chadi and Harrison) $17^{th}$ (1985) 833-36.

Bresser, W.; Boolchand, P.; Suranyi, P., Rigidity Percolation and Molecular Clustering in Network Glasses, Phys. Rev. Lett. 56 (1986) 2493-2496.

Bresser, W.J.; Boolchand, P.; Suranyi, P.; de Neufville, J.P., Intrinsically Broken Chalcogen Chemical Order in Stoichiometric Glasses, Journal de Physique 42 (1981) C4-193-C4-196.

Bresser, W.J.; Boolchand, P.; Suranyi, P.; Hernandez, J.G., Molecular Phase Separation and Cluster Size in GeSe2 glass, Hyperfine interactions 27 (1986) 389-392.

Cahen, D.; Gilet, J.-M.; Schmitz, C.; Chemyak, L.; Gartsman, K.; Jakubowicz, A., Room-temperature, Electric Field Induced Creation of Stable Devices in CuInSe2 Crystals, Science 258 (1992) 271-274.

Chatterjee, R.; Asokan, S.; Titus, S.S.K., Current-controlled Negative-resistance Behavior and Memory Switching in Bulk As-Te-Se Glasses, J. Phys. D: Appl. Phys. 27 (1994) 2624-2627.

Chen, C.H.; Tai, K.L. , Whisker Growth Induced by Ag Photodoping in Glassy GexSe1-x Films, Appl. Phys. Lett. 37 (1980) 1075-1077.

Chen, G.; Cheng, J., Role of Nitrogen in the Crystallization of Silicon Nitride-doped Chalcogenide Glasses, J. Am. Ceram. Soc. 82 (1999) 2934-2936.

Chen, G.; Cheng, J.; Chen, W., Effect of SI3N4 on Chemical Durability of Chalcogenide Glass, J. Non-Cryst. Solids 220 (1997) 249-253.

Cohen, M.H.; Neale, R.G.; Paskin, A., A Model for an Amorphous Semiconductor Memory Device, J. Non-Cryst. Solids 8-10 (1972) 885-891.

Croitoru, N.; Lazarescu, M.; Popescu, C.; Telnic, M.; and Vescan, L., Ohmic and Non-ohmic Conduction in Some Amorphous Semiconductors, J. Non-Cryst. Solids 8-10 (1972) 781-786.

Dalven, R.: Gill, R., Electrical Properties of Beta-Ag2Te and Beta-Ag2Se From 4.2° to 300° K, J. Appl. Phys. 38 (1967) 753-756.

Davis, E.A., Semiconductors Without Form, Search 1 (1970) 152-155.

Dearnaley, G.; Stoneham, A.M.; Morgan, D.V., Electrical Phenomena in Amorphous Oxide Films, Rep. Prog. Phys. 33 (1970) 1129-1191.

Dejus, R.J.; Susman, S.; Volin, K.J.; Montague, D.G.; Price, D.L., Structure of Vitreous Ag-Ge-Se, J. Non-Cryst. Solids 143 (1992) 162-180.

den Boer, W., Threshold Switching in Hydrogenated Amorphous Silicon, Appl. Phys. Lett. 40 (1982) 812-813.

Drusedau, T.P.; Panckow, A.N.; Klabunde, F., The Hydrogenated Amorphous Silicon/nanodisperse Metal (SIMAL) System-Films of Unique Electronic Properties, J. Non-Cryst. Solids 198-200 (1996) 829-832.

El Bouchairi, B.; Bernede, J.C.; Burgaud, P., Properties fo Ag2-xSe1+x/n-Si Diodes, Thin Solid Films 110 (1983) 107-113.

El Gharras, Z.; Bourahla, A.; Vautier, C., Role of Photoinduced Defects in Amorphous GexSe1-x Photoconductivity, J. Non-Cryst. Solids 155 (1993) 171-179.

El Ghrandi, R.; Calas, J.; Galibert, G.; Averous, M., Silver Photodissolution in Amorphous Chalcogenide Tthin Films, Thin Solid Films 218 (1992) 259-273.

El Ghrandi, R.; Calas, J.; Galibert, G., Ag Dissolution Kinetics in Amorphous GeSe5.5 Thin Films from "In-situ" Resistance Measurements vs. Time, Phys. Stat. Sol. (a) 123 (1991) 451-460.

El-kady, Y.L., The Threshold Switching in Semiconducting Glass Ge21Se17Te62, Indian J. Phys. 70A (1996) 507-516.

Elliott, S.R., A Unified Mechanism for Metal Photodissolution in Amorphous Chalcogenide Materials, J. Non-Cryst. Solids 130 (1991) 85-97.

Elliott, S.R., Photodissolution of Metals in Chalcogenide Glasses: A Unified Mechanism, J. Non-Cryst. Solids 137-138 (1991) 1031-1034.

Elsamanoudy, M.M.; Hegab, N.A.; Fadel, M., Conduction Mechanism in the Pre-switching State of Thin Films Containing Te As Ge Si, Vacuum 46 (1995) 701-707.

El-Zahed, H.; El-Korashy, A., Influence of Composition on the Electrical and Optical Properties of Ge20BixSe80-x Films, Thin Solid Films 376 (2000) 236-240.

Fadel, M., Switching Phenomenon in Evaporated Se-Ge-As Thin Films of Amorphous Chalcogenide Glass, Vacuum 44 (1993) 851-855.

Fadel, M.; El-Shair, H.T., Electrical, Thermal and Optical Properties of Se75Ge7Sb18, Vacuum 43 (1992) 253-257.

Feng, X. Bresser, W.J.; Boolchand, P., Direct Evidence for Stiffness Threshold in Chalcogenide Glasses, Phys. Rev. Lett. 7B (1997) 4422-4425.

Feng, X. Bresser, W.J.; Zhang, M.; Goodman, B.; Boolchand, P., Role of Network Connectivity on the Elastic, Plastic and Thermal Behavior of Covalent Glasses, J. Non-Cryst. Solids 222 (1997) 137-143.

Fischer-Colbrie, A.: Bienenstock, A.; Fuoss, P.H.; Marcus, M.A., Structure and Bonding in Photodiffused Amorphous Ag-GeSe2 Thin Films, Phys. Rev. B 38 (1988) 12388-12403.

Fleury, G.; Hamou, A.; Viger, C.; Vautier, C., Conductivity and Crystallization of Amorphous Selenium, Phys. Stat. Sol. (a) 64 (1981) 311-316.

Fritzsche, H, Optical and Electrical Energy Gaps in Amorphous Semiconductors, J. Non-Cryst. Solids 6 (1971) 49-71.

Fritzsche, H., Electronic Phenomena in Amorphous Semiconductors, Annual Review of Materials Science 2 (1972) 697-744.

Gates, B.; Wu, Y.; Yin, Y.; Yang, P.; Xia, Y., Single-crystalline Nanowires of Ag2Se can be Synthesized by Templating Against Nanowires of Ttrigonal Se, J. Am. Chem. Soc. (2001) currently ASAP.

Gosain, D.P.; Nakamura, M.; Shimizu, T.; Suzuki, M.; Okano, S., Nonvolatile Memory Based on Reversible Phase Transition Phenomena in Telluride Glasses, Jap. J. Appl. Phys. 28 (1989) 1013-1018.

Guin, J.-P.; Rouxel, T.; Keryvin, V.; Sangleboeuf, J.-C.; Serre, I.; Lucas, J., Indentation Creep of Ge-Se Chalcogenide glasses Below Tg: Elastic Recovery and Non-Newtonian Flow, J. Non-Cryst. Solids 298 (2002) 260-269.

Guin, J.-P.; Rouxel, T.; Sangleboeuf, J.-C; Melscoet, I.; Lucas, J., Hardness, Toughness, and Scratchability of Germanium-selenium Chalcogenide Glasses, J. Am. Ceram. Soc. 85 (2002) 1545-52.

Gupta, Y.P., On Electrical Switching and Memory Effects in Amorphous Chalcogenides, J. Non-Cryst. Sol. 3 (1970) 148-154.

haberland, D.R.; Stiegler, H., New Experiments on the Charge-controlled Switching Effect in Amorphous Semiconductors, J. Non-Cryst. Solids 8-10 (1972) 408-414.

Haifz, M.M.; Ibrahim, M.M.; Dongol, M.; Hammad, F.H., Effect of Composition on the Structure and Electrical Properties of As-Se-Cu Glasses, J. Apply. Phys. 54 (1983) 1950-1954.

Hajto, J.; Rose, M.J.; Osborne, I.S.; Snell, A.J.; Le Comber, P.G.; Owen, A.E., Quantization Effects in Metal/a-Si:H/metal Devices, Int. J. Electronics 73 (1992) 911-913.

Hajto, J.; Hu, J.; Snell, A.J.; Turvey, K.; Rose, M., DC and AC Measurements on Metal/a-Si:H/metal Room Temperature Quantised Resistance Devices, J. Non-Cryst. Solids 266-269 (2000) 1058-1061.

Hajto, J.; McAuley, B.; Snell, A.J.; Owen, A.E., Theory of Room Temperature Quantized Resistance Effects in Metal-a-Si:H-metal Thin Film Structures, J. Non-Cryst. Solids 198-200 (1996) 825-828.

Hajto, J.; Owen, A.E.; Snell, A.J.; Le Comber, P.G.; Rose, M.J., Analogue Memory and Ballistic Electron Effects in Metal-amorphous Silicon Structures, Phil, Mag. B 63 (1991) 349-369.

Hayashi, T.; Ono, Y.; Fukaya, M.; Kan, H., Polarized Memory Switching in Amorphous Se Film, Japan. J. Appl. Phys. 13 (1974) 1163-1164.

Hegab, N.A.; Fadel, M.; Sedeek, K., Memory Switching Phenomena in Thin Films of Chalcogenide Semiconductors, Vacuum 45 (1994) 459-462.

Helbert et al., *Intralevel Hybrid Resist Process with Submicron Capability*, SPIE vol. 333 Submicron Lithography, pp. 24-29 (1982).

Hilt, Dissertation: *Materials Characterization of Silver Chalcogenide Programmable Metalization Cells*, Arizona State University, pp. Title p. 114 (UMI Company, May 1999).

Hirose et al., *High Speed Memory Behavior and Reliability of an Amorphous $As_2S_3$ Film Doped* with Ag, Phys. Stat. Sol. (a) 61, pp. 87-90 (1980).

Hirose, Y.; Hirose, H., Polarity-dependent Memory Switching and Behavior of Ag Dendrite in Ag-photodoped Amorphous As2S3 Films, J. Appl. Phys. 47 (1976) 2767-2772.

Holmquist et al., *Reaction and Diffusion in Silver-Arsenic chalcogenide Glass Systems*, 62 J. Amer. Ceram. Soc., No. 3-4, pp. 4183-188 (Mar.-Apr. 1979).

Hong, K.S.; Speyer, R.F., Switching Behavior in II-Iv-V2 Amorphous Semiconductor Systems, J. Non-Cryst. Solids 116 (1990) 191-200.

Hosokawa, S., Atomic and Electronic Structures of Glassy GexSe1-x Around the Stiffness Threshold Composition, J. Optoelectronics and Advanced Materials 3 (2001) 199-214.

Hu, J.; Snell, A.J.; Hajto, J.; Owen, A.E., Constant Current Forming in Cr/p+a-Si:H/V Thin Film Devices, J. Non-Cryst. Solids 227-230 (1998) 1187-1191.

Hu, J.; Hajto, J.; Snell, A.J.; Owen, A.E.; Rose, M.J., Capacitance Anomaly Near the Metal-Non-metal Transition in Cr-hydrogenated Amorphous Si-V Thin-film Devices, Phil. Mag. B. 74 (1996) 37-50.

Hu, J.; Snell, A.J.; Hajto, J.; Owen, A.E., Current-induced Instability in Cr-p+a-Si:H-V Thin Film Devices, Phil. Mag. B 80 (2000) 29-43.

Huggett et al., Development of Silver Sensitized Germanium Selenide Photoresist by Reactive Sputter Etching in SF6, 42 Appl. Phys. Lett., No. 7, pp. 592-594 (Apr. 1983).

Iizima, S.; Sugi, M.; Kikuchi, M.; Tanaka, K., Electrical and Thermal Properties of Semiconducting Glasses As-Te-Ge, Solid State Comm. 8 (1970) 153-155.

Ishikawa, R.; Kikuchi, M., Photovoltaic Study on the Photo-enhanced Diffusion of Ag in Amorphous Films of Ge2S3, J. Non-Cryst. Solids 35 & 36 (1980) 1061-1066.

Iyetomi, H.; Vashishta, P.; Kalia, R.K., Incipient Phase Separation in Ag/Ge/Se Glasses: Clustering of Ag Atoms, J. Non-Cryst. Solids 262 (2000) 135-142.

Jones, G.; Collins, R.A., Switching Properties of thin Selenium Films Under Pulsed Bias, Thin Solid Films 40 (1977) L15-L18.

Joullie, A.M.; Marucchi, J., On the DC Electrical Conduction of Amorphous As2Se7 Before Switching, Phys. Stat. Sol. (a) 13 (1972) K105-109.

Joullie, A.M.; Marucchi, J., Electrical Properties of the Amorphous Alloy As2Se5, Mat. Res. Bull. 8 (1973) 433-441.

Kaplan, T.; Adler, D., Electrothermal Switching in Amorphous Semiconductors, J. Non-Cryst. Solids 8-10 (1972) 538-543.

Kawaguchi et al., *Mechanism of Photosurface Deposition*, 164-166 J. Non-Cryst. Solids, pp. 1231-1234 (1993).

Kawaguchi, T.; Maruno, S.; Elliott, S.R., Optical, Electrical, and Structural Properties of Amorphous Ag-Ge-S and Ag-Ge-Se Films and Comparison of Photoinduced and Thermally Induced Phenomena of Both Systems, J. Appl. Phys. 79 (1996) 9096-9104.

Kawaguchi, T.; Masui, K., Analysis of Change in Optical Ttransmission Spectra Resulting from Ag Photodoping in Chalcogenide Film, Japn. J. Appl. Phys. 26 (1987) 15-21.

Kawamoto, Y., Nishidam, M., Ionic Condition in As2S3—Ag2S, GeS2—GeS—Ag2S and P2S5-Ag2S Glasses, J. Non-Cryst Solids 20 (1976) 393-404.

Kawasaki, M.; Kawamura, J.; Nakamura, Y.; Aniya, M., Ionic Conductivity of Agx(GeSe3)1-x (0<=x<=0.571) Glasses, Solid State Ionics 123 (1999) 259-269.

Kluge, G.; Thomas, A.; Klabes, R.; Grotzschel, R., Suptitz, P. Silver Photodiffusion in Amorphous GexSe100-x, J. Non-Cryst. Solids 124 (1990) 186-193.

Kolobov, A.V., On the Origin of P-type Conductivity in Amorphous Chalcogenides, J. Non-Cryst. Solids 198-200 (1996) 728-731.

Kolobov, A.V., Lateral Diffusion of Silver in Vitreous Chalcogenide Films, J. Non-Cryst. Solids 137-138 (1991) 1027-1030.

Kolobov et al., Photodoping of Amorphous Chalcogenides by Metals, Advances in Physics, 1991, vol. 40, No. 5, pp. 625-684.

Korkinova, Ts.N.; Andreichin, R.E., chalcogenide Glass Polarization and the Type of Contacts, J. Non-Cryst. Solids 194 (1996) 256-259.

Kotkata, M.F.; Afifi M.A.; Labib, H.H.; Hegab, N.A.; Abdel-Aziz, M.M., Memory Switching in Amorphous GeSeTl Chalcogenide Semiconductor Films, Thin Solids Films 240 (1994) 143-146.

Kozicki et al., Silver Incorporation in Thin Films of Selenium Rich Ge-Se Glasses, International Congress on Glass, Vol. 2, Extended Abstracts, Jul. 2001, pp. 8-9.

Michael N. Kozicki, 1. Programmable Metallization Cell Technology Description, Feb. 18, 2000.

Michael N. Kozicki, Axon Technologies Corp. and Arizona State University, Presentation to Micron Technology, Inc., Apr. 6, 2000.

Kozicki et al., Applications of Programmable Resistance Changes in Metal-doped chalcogenides, Electrochemical Society Proceedings, vol. 99-13, 1999, pp. 298-309.

Kozicki et al., Nanoscale Effects in Devices Based on Chalcogenide Solid Solutions, Supertattices and Microstructures, vol. 27, No. 5/6, 2000, pp. 485-488.

Kozicki et al., Nanoscale Phase Separation in Ag-Ge-Se Glasses, Microelectronic Engineering 63 (2002) pp. 155-159.

Lakshminarayan, K.N.; Srivastava, K.K.; Panwar, O.S.; Kumar, A., Amorphous Semiconductor Devices: Memory and Switching Mechanism, J. Instn Electronics & Telecom. Engrs 27 (1981) 16-19.

Lal, M.; Goyal, N., Chemical Bond Approach to Study the Memory and Threshold Switching Chalcogenide Glasses, Indian Journal of Pure & Appl. Phys. 29 (1991) 303-304.

Leimer, F.; Stotzel, H.; Kottwitz, A., Isothermal Electrical Polarisation of Amorphous GeSe Films with Blocking Al Contacts Influenced by Poole-Frenkel Conduction, Phys. Stat. Sol. (a) 29 (1975) K129-K132.

Leung, W.; Cheung, N.; Neureuther, A.R., Photoinduced Diffusion of Ag in GexSe1-x Glass, Appl. Phys. Lett. 46 (1985) 543-545.

Matsushita, T.; Yamagami, T.; Okuda, M., Polarized Memory Effect Observed on Se-SnO2 System, Jap. J. Appl. Phys. 11 (1972) 1657-1662.

Matsushita, T.; Yamagami, T.; Okuda, M., Polarized Memory Effect Observed on Amorphous Selenium Thin Films, Jpn. J. Appl. Phys. 11 (1972) 606.

Mazurier, F.; Levy, M.; Souquet, J.L, Reversible and Irreversible Electrical Switching in TeO2-V2O5 Based Glasses, Journal de Physique IV 2 (1992) C2-185—C2-188.

McHardy et al., The Dissolution of Metals in Amorphous Chalcogenides and the Effects of Electron and Ultraviolet Radiation, 20 J. Phys. C.: Solid State Phys., pp. 4055-4075 (1987).

Messoussi, R.; Bernede, J.C.; Benhida, S.; Abachi, T.; Latef, A., Electrical Characterization of M/Se Strcutres (M=Ni,Bi), Mat. Chem. And Phys. 28 (1991) 253-258.

Mitkova, M.; Boolchand, P., Microscopic Origin of the Glass Forming Tendency in Chalcohalides and Constraint Theory, J. Non-Cryst. Solids 240 (1998) 1-21.

Mitkova, M.; Kozicki, M.N., Silver Incorporation in Ge-Se Glasses Used in programmable Metallization Cell Devices, J. Non-Cryst. Solids 299-302 (2002) 1023-1027.

Mitkova, M.; Wang, Y.; Boolchand, P., Dual Chemical Role of Ag as an Additive in Chalcogenide Glasses, Phys. Rev. Lett. 83 (1999) 3848-3852.

Miyatani, S.-y., Electronic and Ionic Conduction in (AgxCu1-x)2Se, J. Phys. Soc. Japan 34 (1973) 423-432.

Miyatani, S.-y., Electrical Properties of Ag2Se, J. Phys. Soc. Japan 13 (1958) 317.

Miyatani, s.-y., Ionic conduction in Beta-Ag2Te and Beta-Ag2Se, Journal Phys. Soc. Japan 14 (1959) 996-1002.

Mott, N.F., Condcution in Glasses Containing Transition Metal Ions, J. Non-Cryst. Solids 1 (1968) 1-17.

Nakayama, K.; Kitagawa, T.; Ohmura, M.; Suzuki, M., Nonvolatile Memory Based on Phase Transition in Chalcogenide Thin Films, Jpn. J. Appl. Phys. 32 (1993) 564-569.

Nakayama, K.; Kojima, K.; Hayakawa, F.; Imai, Y.; Kitagawa, A.; Suzuki, M., Submicron Nonvolatile Memory Cell Based on Reversible Phase Transition in Chalcogenide Glasses, Jpn. J. Appl. Phys. 39 (2000) 6157-6161.

Nang, T.T.; Okuda, M.; Matsushita, T.; Yokota, S.; Suzuki, A., Electrical and Optical Properties of GexSe1-x Amorphous Thin Films, Jap. J. App. Phys. 15 (1976) 849-853.

Narayanan, R.A.; Asokan, S.; Kumar, A., Evidence Concerning the Effect of Topology on Electrical Switching in Chalcogenide Network Glasses, Phys. Rev. B 54 (1996) 4413-4415.

Neale, R.G.; Aseltine, J.A., The Application of Amorphous Materials to Computer Memories, IEEE Transactions on Electron Dev. Ed-20 (1973) 195-209.

Ovshinsky S.R.; Fritzsche, H., Reversible Structural Transformations in Amorphous Semiconductors for Memory and Logic, Metalurgical Transactions 2 (1971) 641-645.

Ovshinsky, S.R., Reversible Electrical Switching Phenomena in Disordered Structures, Phys. Rev. Lett. 21 (1968) 1450-1453.

Owen, A.E.; LeComber, P.G.; Sarrabayrouse, G.; Spear, W.E., New Amorphous-silicon Electrically Programmable Nonvolatile Switching Device, IEE Proc. 129 (1982) 51-54.

Owen, A.E.; Firth, A.P.; Ewen, P.J.S., Photo-induced Structural and Physico-chemical Changes in Amorphous Chalcogenide Semiconductors, Phil. Mag. B 52 (1985) 347-362.

Owen, A.E.; Le Comber, P.G.; Hajto, J.; Rose, M.J.; Snell, A.J., Switching in Amorphous Devices, Int. J. Electronics 73 (1992) 897-906.

Owen et al., Metal-Chalcogenide Photoresists for High Resolution Lithography and Sub-Micron Structures, Nanostructure Physics and Fabrication, pp. 447-451 (M. Reed ed. 1989).

Pattanayak, P.; Asokan, S., Signature of a Silver Phase Percolation Threshold in Microscopically Phase Separated Ternary $Ge_{0.15}Se_{0.85-x}Ag_x$ ($0 \leq k \leq 0.20$) Glasses, J. App. Phys. 97 (published online Dec. 13, 2004).

Pearson, A.D.; Miller, C.E., Filamentary Conduction in Semiconducting Glass Diodes, App. Phys. Lett. 14 (1969) 280-282.

Pinto, R.; Ramanathan, K.V., Electric Field Induced Memory Switching in Thin Films of the Chalcogenide System Ge-As-Se, Appl. Phys. Lett. 19 (1971) 221-223.

Popescu, C., The Effect of Local Non-uniformities on Thermal Switching and High Field Behavior of Structures with Chalcogenide Glasses, Solid-State Electronics 18 (1975) 671-681.

Popescu, C.; Croitoru, N., The Contribution of the Lateral Thermal Instability to the Switching Phenomenon, J. Non-Cryst. Solids 8-10 (1972) 531-537.

Popov, A.I.; Geller, I.KH.; Shemetova, V.K., Memory and Threshold Switching Effects in Amorphous Selenium, PHys. Stat. Sol. (a) 44 (1977) K71-K73.

Prakash, S.; Asokan, S.; Ghare, D.B., Easily Reversible Memory Switching in Ge-As-Te Glasses, J. Phys. D: Appl. Phys. 29 (1996) 2004-2008.

Rahman, S.; Sivarama Sastry, G., Electronic Switching in Ge-Bi-Se-Te Glasses, Mat. Sci. and Eng. B12 (1992) 219-222.

Ramesh, K.; Asokan, S.; Sangunni, K.S.; Gopal, E.S.R., Electrical Switching in Germanium Telluride Glasses Doped with Cu and Ag, Appl. Phys. A 69 (1999) 421-425.

Rose,M.J.;Hajto,J.;Lecomber,P.G.;Gage,S.M.;Choi,W.K.;Snell,A.J.;Owen,A.E., Amorphous Silicon Analogue Memory Devices, J. Non-Cryst. Solids 115 (1989) 168-170.

Rose,M.J.;Snell,A.J.;Lecomber,P.G.;Hajto,J.;Fitzgerald,A.G.;Owen,A.E., Aspects of Non-volatility in a -Si:H Memory Devices, Mat. Res. Soc. Symp. Proc. V 258, 1992, 1075-1080.

Schuocker, D.; Rieder, G., On the Reliability of Amorphous Chalcogenide Switching Devices, J. Non-Cryst. Solids 29 (1978) 397-407.

Sharma, A.K.; Singh, B., Electrical Conductivity Measurements of Evaporated Selenium Films in Vacuum, Proc. Indian Natn. Sci. Acad. 46, A, (1980) 362-368.

Sharma, R. P., Structural, Electrical and Optical Properties of Silver Selenide Films, Ind. J. Of Pure and Applied Phys. 35 (1997) 424-427.

Shimizu et al., *The Photo-Erasable Memory Switching Effect of Ag Photo-Doped Chalcogenide Glasses*, 46 B. Chem Soc. Japan, No. 12, pp. 3662-3665 (1973).

Snell, A.J.; Lecomber, P.G.; Hajto, J.; Rose, M.J.; Owen, A.E.; Osborne, I.S., Analogue Memory Effects in Metal/a-Si:H/metal Memory Devices, J. Non-Cryst. Solids 137-138 (1991) 1257-1262.

Snell, A.J.; Hajto, J.;Rose, M.J.; Osborne, I.S.; Holmes, A.; Owen, A.E.; Gibson, R.A.G., Analogue Memory Effects in Metal/a-Si:H/metal Thin Film Structures, Mat. Res. Soc. Symp. Proc. V 297, 1993, 1017-1021.

Steventon, A.G., Microfilaments in Amorphous Chalcogenide Memory Devices, J. Phys. D: Appl. Phys. 8 (1975) L120-L122.

Steventon, A.G., The Switching Mechanisms in Amorphous Chalcogenide Memory Devices, J. Non-Cryst. Solids 21 (1976) 319-329.

Stocker, H.J., Bulk and Thin Film Switching and Memory Effects in Semiconducting Chalcogenide Glasses, App. Phys. Lett. 15 (1969) 55-57.

Tanaka, K., Ionic and Mixed Conductions in Ag Photodoping Process, Mod. Phys. Lett B 4 (1990) 1373-1377.

Tanaka, K.; Iizima, S.; Sugi, M.; Okada, Y.; Kikuchi, M., Thermal Effect on Switching Phenomenon in Chalcogenide Amorphous Semiconductors, Solid state Comm. 8 (1970) 387-389.

Thornburg, D.D., Memory Switching in a Type I Amorphous Chalcogenide, J. Elect. Mat. 2 (1973) 3-15.

Thornburg, D.D., Memory Switching in Amorphous Arsenic Triselenide, J. Non-Cryst. Solids 11 (1972) 113-120.

Thornburg, D.D.; White, R.M., Electric Field Enhanced Phase Separation and Memory Switching in Amorphous Arsenic Triselenide, Journal (1972) 4609-4612.

Tichy, L.; Ticha, H., Remark on the Glass-forming Ability in GexSe1-x and AsxSe1-x Systems, J. Non-Cryst. Solids 261 (2000) 277-281.

Tutus, S.S.K.; Chatterjee, R.; Asokan, S., Electrical Switching and Short-range Order in As-Te Glasses, Phys. Rev. B 48 (1993) 14650-14652.

Tranchant,S.;Peytavin,S.;Ribes,M.;Flank,A.M.;Dexpert,H.;Lagarde,J.P., Silver Chalcogenide Glasses Ag-Ge-Se: Ionic Conduction and Exafs Structural Investigation, Transport-structure Relations in Fast Ion and Mixed conductors Proceedings of the 6th Riso International Symposium. Sep. 9-13, 1985, pp. 425-430.

Tregouet, Y.; Bernede, J.C., Silver Movements in Ag2Te Thin Films: Switching and Memory effects, Thin Solid Films 57 (1979) 49-54.

Uemura, O.; Kameda, Y.; Kokai, S.; Satow, T., Thermally Induced Crystallization of Amorphous Ge0.4Se0.6, J. Non-Cryst. Solids 117-118 (1990) 219-221.

Uttecht, R.: Stevenson, H.; Sie, C.H.; Griener, J.D.; Raghavan, K.S., Electric Field Induced Filament Formation in As-Te-Ge Glass, J. Non-Cryst. Solids 2 (1970) 358-370.

Viger, C.; Lefrancois, G.; Fleury, G., Anomalous Behaviour of Amorphous Selenium Films, J. Non-Cryst. Solids 33 (1996) 267-272.

Vodenicharov, C.; Parvanov,S.; Petkov,P., Electrode-limited Currents in the Thin-film M-GeSe-M System, Mat. Chem. And Phys. 21 (1989) 447-454.

Wang, S.-J.; Misium, G.R.; Camp, J.C.; Chen, K.-L.; Tigelaar, H.L., High-performance Metal/silicide Antifuse, IEEE Electron Dev. Lett. 13 (1992) 471-472.

Weirauch, D.F., Threshold Switching and Thermal Filaments in Amorphous Semiconductors, App. Phys. Lett. 16 (1970) 72-73.

West, W.C.; Sieradzki, K.; Kardynal, B.; Kozicki, M.N., Equivalent Circuit Modeling of the Ag|As0.24S0.36Ag0.40|Ag System Prepared by Photodissolution of Ag, J. Electrochem. Soc. 145 (1998) 2971-2974.

West, W.C., Electrically Erasable Non-volatile Memory Via Electrochemical Deposition of Multifractal Aggregates, Ph.D. dissertation, ASU 1998, 189 pages.

Zhang, M.; Mancini, S.; Bresser, W.; Boolchand, P., Variation of Glass Transition Temperature, Tg, with Average Coordination Number, <m>, in Network Glasses: Evidence of a Threshold Behavior in the Slope |dTg/d<m>| at the Rigidity Percolation Threshold (<m>=2.4), J. Non-Cryst. Solids 151 (1992) 149-154.

* cited by examiner

METHOD AND APPARATUS FOR ACCESSING A MEMORY ARRAY

FIELD OF THE INVENTION

The invention relates to the field of random access memory (RAM) devices formed using a resistance variable material.

BACKGROUND OF THE INVENTION

Resistance variable memory elements, which include Programmable Conductive Random Access Memory (PCRAM) elements, have been investigated for suitability as semi-volatile and non-volatile random access memory devices. A typical resistance variable memory element formed using a chalcogenide glass backbone is disclosed in U.S. Pat. No. 6,348,365 to Moore and Gilton.

In a typical chalcogenide glass resistance variable memory element, a conductive material, such as silver, is incorporated into the chalcogenide glass. The resistance of the chalcogenide glass can be programmed to stable higher resistance and lower resistance states. An unprogrammed chalcogenide variable resistance element is normally in a higher resistance state. A write operation programs the element to a lower resistance state by applying a voltage potential across the chalcogenide glass and forming a conductive pathway. The element may then be read by applying a voltage pulse of a lesser magnitude than required to program it; the resistance across the memory device is then sensed as higher or lower to define two logic states.

The programmed lower resistance state of a chalcogenide variable resistance element can remain intact for a considerable period of time, typically ranging from hours to weeks, after the voltage potentials are removed. The element can be returned to its higher resistance state by applying a reverse voltage potential of about the same order of magnitude as used to write the device to the lower resistance state. Again, the higher resistance state is maintained in a semi- or non-volatile manner once the voltage potential is removed. In this way, such an element can function as a variable resistance non-volatile memory having at least two resistance states, which can define two respective logic states, i.e., at least a bit of data.

A plurality of resistance variable memory devices can be included in a memory array. In doing so, it is desirable to provide a greater number of memory elements within a particular area.

BRIEF SUMMARY OF THE INVENTION

Exemplary embodiments of the invention provide a resistance variable memory device including first and second memory elements and methods for operating the same. The first and second memory elements each have first and second electrodes. The first electrode of the first and second memory elements is a common first electrode and is located below the second electrodes. A first line is connected to the second electrode of the first memory element and a second line connected to the second electrode of the second memory element. The first and second lines are switchably connected to a third line for applying a voltage to the second electrodes.

BRIEF DESCRIPTION OF THE DRAWINGS

The foregoing and other advantages and features of the invention will become more apparent from the detailed description of exemplary embodiments provided below with reference to the accompanying drawings in which.

DETAILED DESCRIPTION OF THE INVENTION

In the following detailed description, reference is made to various specific embodiments of the invention. These embodiments are described with sufficient detail to enable those skilled in the art to practice the invention. It is to be understood that other embodiments may be employed, and that various structural, logical and electrical changes may be made without departing from the spirit or scope of the invention.

The term "substrate" used in the following description may include any supporting structure including, but not limited to, a semiconductor substrate that has an exposed substrate surface. A semiconductor substrate should be understood to include silicon-on-insulator (SOI), silicon-on-sapphire (SOS), doped and undoped semiconductors, epitaxial layers of silicon supported by a base semiconductor foundation, and other semiconductor structures. When reference is made to a semiconductor substrate or wafer in the following description, previous process steps may have been utilized to form regions or junctions in or over the base semiconductor or foundation. The substrate need not be semiconductor-based, but may be any support structure suitable for supporting an integrated circuit, including, but not limited to, metals, alloys, glasses, polymers, ceramics, and any other supportive materials as is known in the art. Additionally, for purposes of this specification, a substrate can include layers and structures over a semiconductor substrate, wafer, or other material, such as conductive lines and/or insulating layers.

The term "resistance variable memory element" is intended to include any memory element, including programmable conductor memory elements, semi-volatile memory elements, and non-volatile memory elements, which exhibit a resistance change in response to applied programming voltages.

Figure 1:
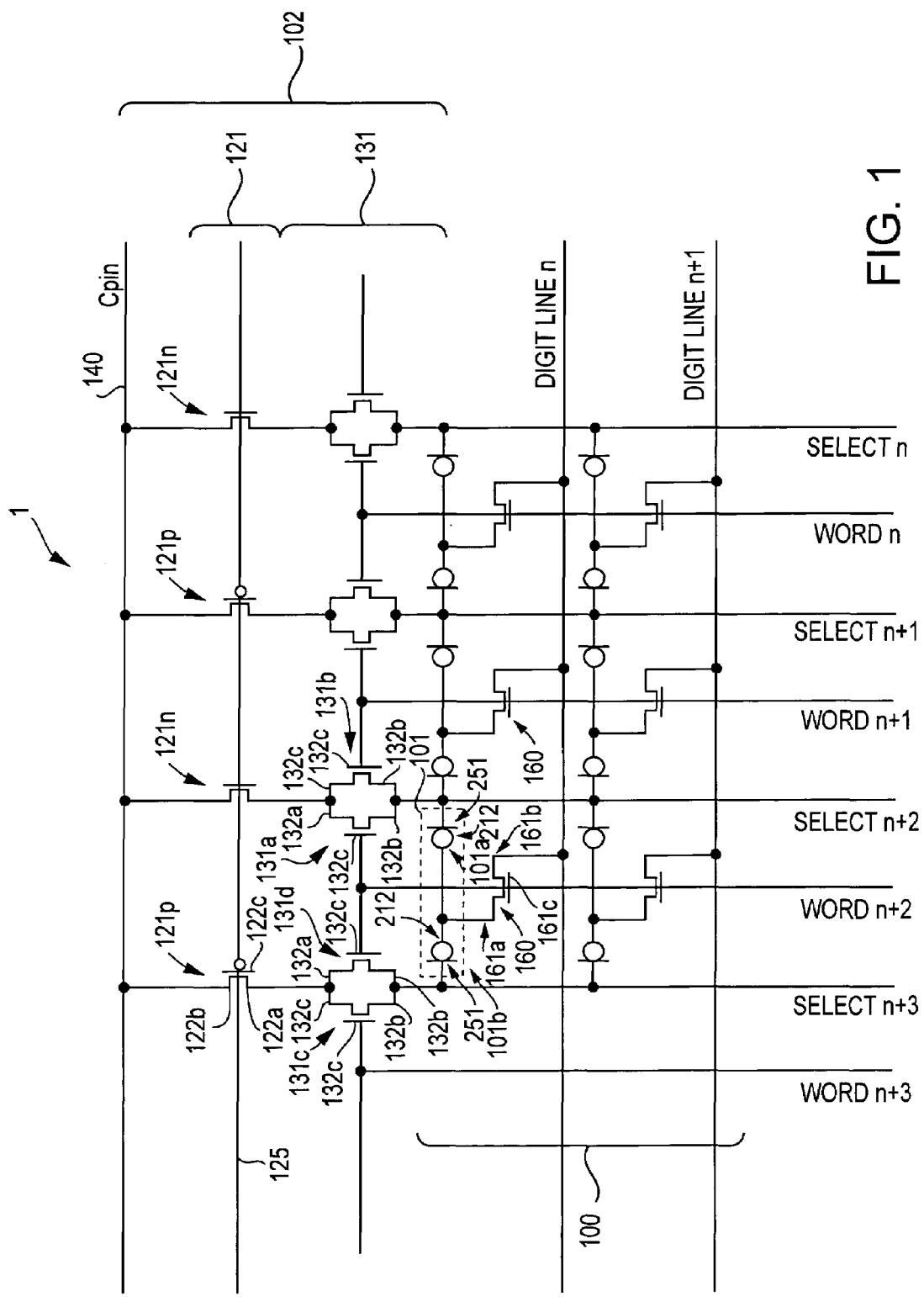
FIG. 1 is a diagram of a memory device according to an exemplary embodiment of the invention.

The invention is now explained with reference to the figures, which illustrate exemplary embodiments and throughout which like reference numbers indicate like features. FIG. 1 depicts a portion of a memory device 1 according to an exemplary embodiment of the invention. The memory device 1 includes a memory array 100 and circuitry 102 for accessing the memory array 100.

The array 100 includes a plurality of memory units 101. Each memory unit 101 includes a plurality of memory elements 101a, 101b. In the illustrated embodiment, each memory unit 101 includes two memory elements, 101a, 101b, each for storing one bit of data, e.g., a logic 1 or 0. In the illustrated embodiment, the memory elements 101a, 101b are resistance variable memory elements arranged in columns and rows. The anodes (first electrodes) 212 of the elements 101a, 101b are coupled to a source/drain region 161a of a transistor 160. A second source/drain region 161b of the transistor 160 is coupled to digit line n and the gate 161c of transistor 160 is coupled to a word line, e.g., word line n+2 as shown in FIG. 1. In a preferred embodiment, the memory elements 101a, 101b of a single memory unit 101 share a common first electrode 212. Such an embodiment is described in more detail below in connection with FIGS. 3A-3C.

As shown in FIG. 1, the cathode (second electrode) 251 of memory element 101a is coupled to a first select line, e.g., select line n+2, while the second electrode 251 of memory element 101b is coupled to a second select line, e.g., select line n+3. Accordingly, a single memory unit 101 is addressable by two different select lines.

Although first electrodes 212 are shown as anodes and second electrodes 251 are shown as cathodes, it should be understood that, alternatively, first electrodes 212 can be cathodes and second electrodes 251 can be anodes.

FIG. 1 also depicts circuitry 102 for accessing particular memory elements 101a, 101b of the memory units 101. A select line, for example, select line n+2 connects to the source/drain region 132b of two select transistors, 131a, 131b. The source/drain regions 132a of the select transistors 131a, 131b are coupled to each other, and the source/drain regions 132b of the select transistors 131a, 131b are coupled to each other. The gate 132c of the select transistor 131a is coupled to word line n+2. Gate 132c of select transistor 131c is connected to word line n+1. The gates 161c of the transistors 160 are also associated with respective word lines. For example, the gate 132c of transistor 131a is connected to word line n+2, which in turn is connected to the gate 161c of a transistor 160; while the gate 132c of transistor 131b is connected to word line n+1, which is connected to the gate 161c of the transistor 160 associated with the memory unit 101.

Likewise, select line n+3 connects to the source/drain region 132b of two select transistors, 131c, 131d. First source/drain regions 132a of the select transistors 131c, 131d are coupled to each other, and second source/drain regions 132b of the select transistors 131c, 131d are coupled to each other. The gate 132c of transistor 131c is connected to word line n+3, while the gate 132c of transistor 131d is connected to word line n+2.

The circuitry 102 also includes a plurality of A/B transistors 121. The A/B transistors alternate in a left right direction of the FIG. 1 array 100 between p-channel 121p and n-channel 121n transistors. In the illustrated embodiment, the source/drain regions 132a of select transistors 131a, 131b are connected to a source/drain region 122a of an n-channel A/B transistor 121n; source/drain regions 132a of select transistors 131c, 131d are connected to a source/drain region 122a of a p-channel A/B transistor 121p. The A/B select line 125 is driven high to operate gates 122c of the n-channel A/B transistors 121n and is driven low to operate gates 122c of the p-channel A/B transistors 121p.

The gates 122c of the A/B transistors 121 are connected to an A/B select line 125. The source drain regions 122b of the A/B transistors 121 are connected to a common Cpin line 140. The Cpin line 140 is used to apply voltage and current to the memory element 101a, 101b second electrodes 251 for read and programming operations.

In the illustrated embodiment, the memory elements 101a, 101b are initially in a high resistance state and can be programmed to a low resistance state. Further, the memory elements 101a, 101b can be reprogrammed (erased) to a high resistance state. Each resistance state represents one of a logic 1 or 0 and can be read from the memory elements 101a, 101b. Write, read and erase are performed by controlling the application of voltages across the memory elements 101a, 101b using the word lines (e.g., word line n+2); select lines(e.g., select lines n+2, n+3); paired transistors 131a, 131b, 131c, 131d; A/B transistors 121n, 121p; transistors 160; and digit lines (e.g., digit line n).

To read or write a particular memory element 101a or 101b, the voltage on Cpin line 140 is applied to the element 101a or 101b. To read or write, for example memory element 101a, a voltage from Cpin line 140 is applied to the second electrode 251 of memory element 101a. For this, the A/B select line 125 is driven high to activate the gate 122c of the A/B transistor 121n. Additionally, a voltage is applied to word line n+2 to activate the gate 132c of select transistor 131a. Thereby, a current can flow from Cpin line 140 to select line n+2 to the second electrode 251 of memory element 101a. Similarly, to apply a voltage from Cpin line 140 to, the second electrode 251 of memory element 101b, the A/B select line 125 is driven low to activate the gate 122c of the A/B transistor 121p. Additionally, a voltage is applied to the word line n+2 to activate the gate 132c of select transistor 131d. Thereby, a current can flow from Cpin line 140 to select line n+3 to the memory element 101b's second electrode 251. Additionally, to read or write memory elements 101a, 101b, a voltage is applied to digit line n.

The voltage value applied to word line n+2 relative to the voltage applied to digit line n and supplied by Cpin line 140 determines what operation is performed on the memory elements 101a, 101b. Exemplary voltages for read and write operations are described in U.S. Pat. No. 6,791,885, assigned to Micron Technology, Inc, which is incorporated herein by reference. It should be appreciated that other voltages can be employed to perform read and write operations.

Figure 2:
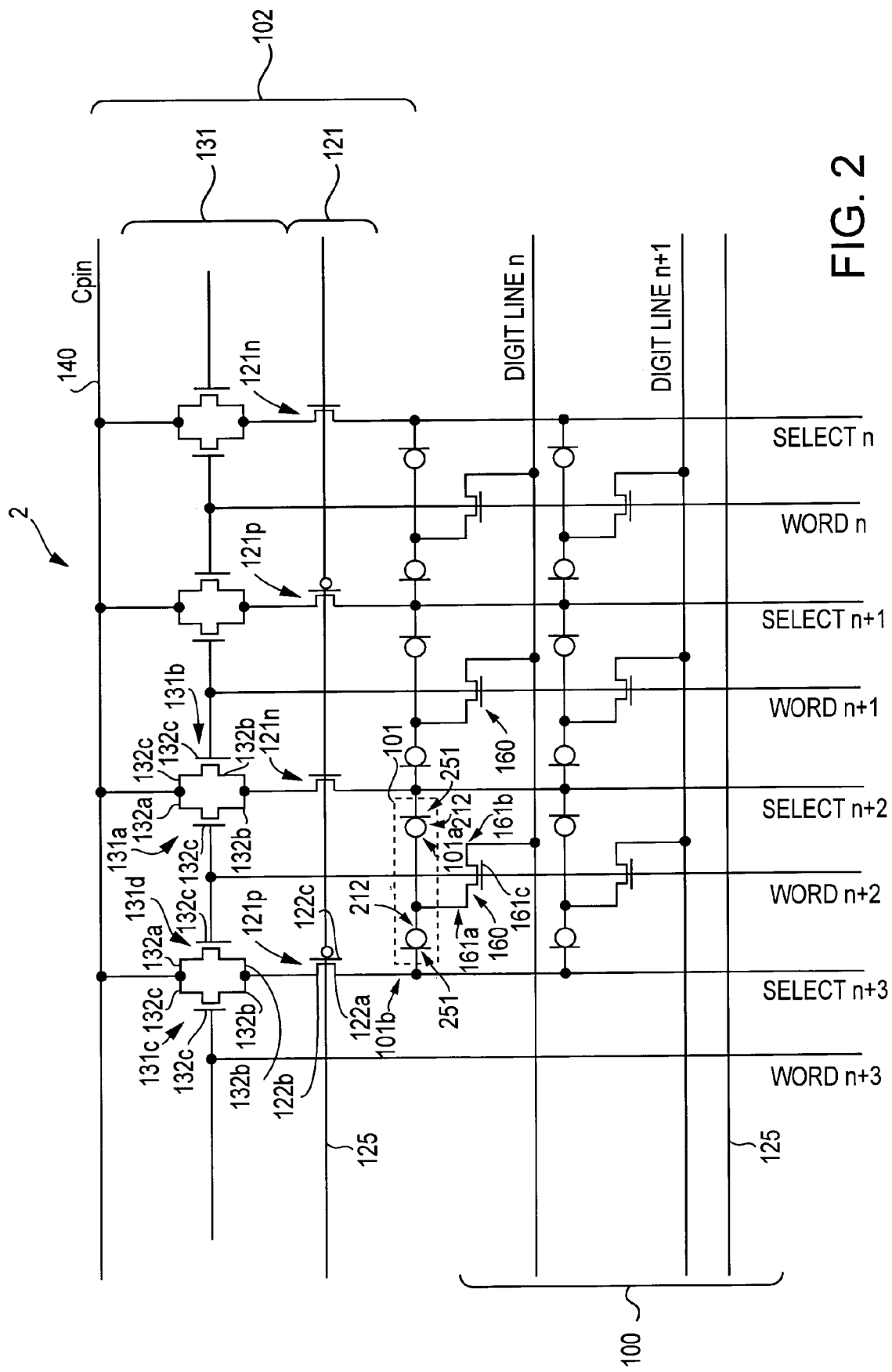
FIG. 2 is a diagram of a memory device according to another exemplary embodiment of the invention.

FIG. 2 illustrates a memory device 2 according to another exemplary embodiment according to the invention. The embodiment illustrated in FIG. 2 is similar to that of FIG. 1, but with the below noted exceptions. As shown in FIG. 2, the source/drain regions 132a of select transistors 131a, 131b, 131c, 131d are connected to Cpin line 140. Further, the source/drain regions 132b of the select transistors 131a, 131b are connected to a source/drain region 122b of an n-channel A/B transistor 121n; the source/drain regions 132b of select transistors 131c, 131d are connected to a source/drain region 122b of a p-channel A/B transistor 121p. The source/drain region 122a of the A/B transistor 121n is connected to select line n+2; and the source drain region 122a of A/B transistor 121p is connected to select line n+3.

Second electrodes 251 of the elements 101a, 101b can be accessed for read and write operations as described above in connection with FIG. 1. That is, to read or write, for example memory element 101a, the A/B select line 125 is driven high to activate the gate 122c of the A/B transistor 121n. Additionally, a voltage is applied to word line n+2 to activate the gate 132c of select transistor 131a. Thereby, a current can flow from Cpin line 140 to select line n+2 and to the second electrode 251 of memory element 101a. Similarly, to apply a voltage from Cpin line 140 to, the second electrode 251 of memory element 101b, the A/B select line 125 is driven low to activate the gate 122c of the A/B transistor 121p. Additionally, a voltage is applied to the word line n+2 to activate the gate 132c of select transistor 131d. Thereby, a current can flow from Cpin line 140 to select line n+3 to the memory element 101b's second electrode 251. As in the case of the memory device 1 (FIG. 1), to read or write memory device 2 memory elements 101a, 101b, a voltage is applied to digit line n. The voltage value applied to word line n+2 relative to the voltage applied to digit line n and supplied by Cpin line 140 determines what operation is performed on the memory elements 101a, 101b.

Figure 3A:
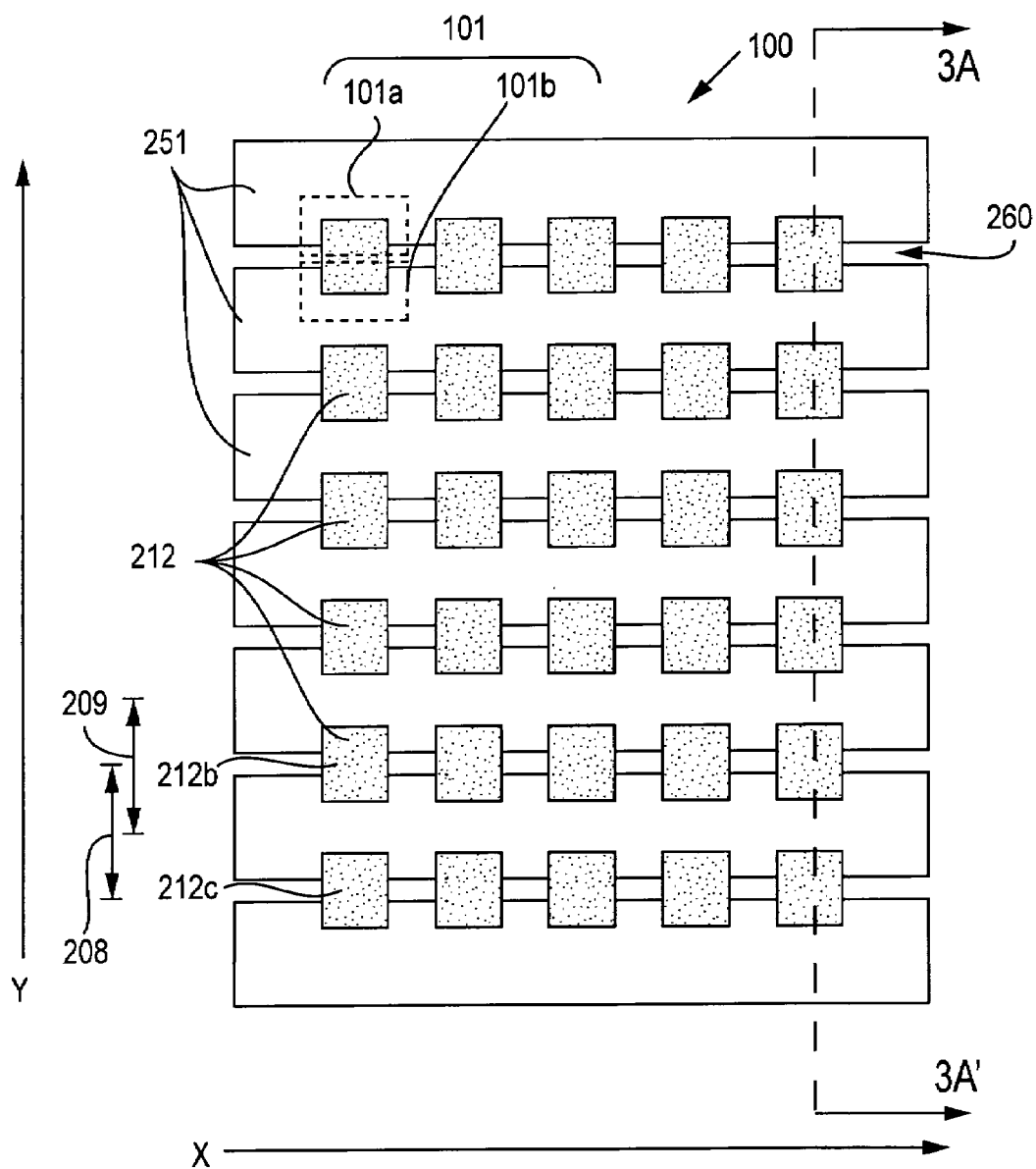
FIG. 3A is a top plan view of a portion of a memory array according to an exemplary embodiment of the invention.
Figure 3B:
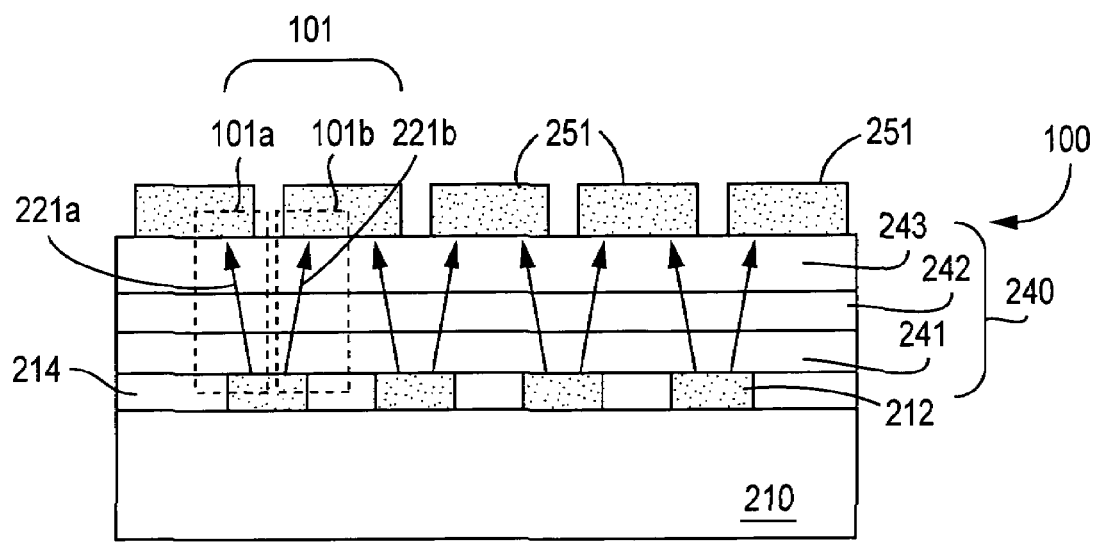
FIG. 3B is a cross sectional view of the memory array of FIG. 3A along liner 3A-3A' and according to an exemplary embodiment of the invention.
Figure 3C:
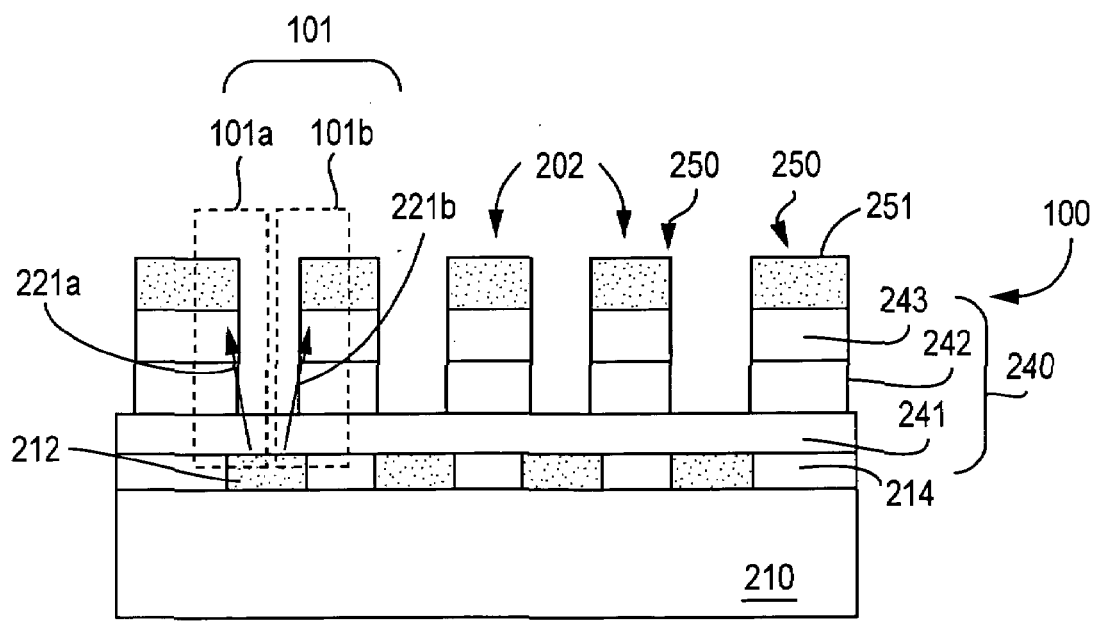
FIG. 3C is a cross sectional view of the memory array of FIG. 3A along liner 3A-3A' and according to another exemplary embodiment of the invention.

FIG. 3A depicts a top view of the memory array 100 according to either exemplary embodiment of the invention. FIG. 3B illustrates a portion of the memory array 100 of FIG. 3A along line 3A-3A' and according to one embodiment. FIG. 3C illustrates a portion of the memory array 100 of FIG. 3A along line 3A-3A' and according to another embodiment.

Referring to FIGS. 3B and 3C, the array 100 is supported by a substrate 210. Over the substrate 210, though not necessarily directly so, is a first (e.g., a bottom) electrode 212 for each memory element 101a, 101b. This electrode 212 is preferably tungsten (W). An insulating layer 214 is between the first electrodes 212 and can be, for example, silicon nitride ($Si_3N_4$), a low dielectric constant material, an insulating glass, or an insulating polymer, but is not limited to such materials.

A memory stack 240 of layers is formed over the first electrodes 212. The stack memory 240 includes one or more layers of resistance variable material. The stack 240 can also include one or more layers of other materials, e.g., metal layers.

In the exemplary embodiments shown in FIGS. 3A-3C, the memory cell stack 240 includes, for example, a chalcogenide material layer 241 (e.g., a chalcogenide glass, such as germanium selenide), a metal-chalcogenide layer 242 (e.g., tin selenide or silver selenide), and a metal layer 243 (e.g., silver). The invention, however, is not limited to such embodiments, and the memory stack 240 can include additional or fewer layers of other materials suitable for forming a resistance variable memory element. For example, the stack 240 can further include a second layer of chalcogenide material (not shown) over the metal layer 243. The second layer of chalcogenide material can be the same material as the chalcogenide material layer 241 or a different material.

In the illustrated embodiments, the chalcogenide material layer 241 is, e.g., germanium selenide ($Ge_xSe_{100-x}$). The germanium selenide may be within a stoichiometric range of about $Ge_{33}Se_{67}$ to about $Ge_{60}Se_{40}$. The chalcogenide material layer 241 may be between about 100 Å and about 1000 Å thick, e.g., about 300 Å thick. Layer 241 need not be a single layer, but may also be comprised of multiple chalcogenide sub-layers having the same or different stoichiometries. The chalcogenide material layer 241 is in electrical contact with the underlying electrodes 212.

Over the chalcogenide material layer 241 is an optional layer of metal-chalcogenide 242, for example tin selenide. Other metal chalcogenide materials may also be used, such as silver-chalcogenide, for example silver selenide. It is also possible that other chalcogenide materials may be substituted for selenium, such as sulfur, oxygen, or tellurium. The tin-chalcogenide layer 242 may be about 100 Å to about 400 Å thick; however, its thickness depends, in part, on the thickness of the underlying chalcogenide material layer 241. The ratio of the thickness of the tin-chalcogenide layer 242 to that of the underlying chalcogenide material layer 241 should be between about 5:1 and about 1:3.

An optional metal layer 243 is provided over the metal-chalcogenide layer 242, with silver (Ag) being the exemplary metal. Desirably, this metal layer 243 is between about 300 Å and about 500 Å thick. Over the metal layer 243 are second electrodes 251. The second electrodes 251 can be formed of the same material as the first electrodes 212, but is not required to be so. In the exemplary embodiment shown in FIGS. 3A-3C, the second electrodes 251 are preferably tungsten (W).

In the embodiment of FIG. 3B, all layers 241, 242, 243 of the memory stack 240 are blanket layers and are continuously shared by all memory elements 101a, 101b of the array 100. In an alternative embodiment shown in FIG. 3C, at least a portion of the stack 240 is patterned to form element stacks 202. Each element stack 202 corresponds to a memory element 101a, 101b. When one or more top layers of the stack 240 are conductive, it is desirable to pattern those layers similarly to the second electrodes 251 to avoid the second electrodes 251 being shorted together. Specifically, in the embodiment illustrated in FIG. 3C, chalcogenide material layer 241 is a blanket layer and is continuously shared by all memory elements 101a', 101b' of the array 100, and tin-chalcogenide layer 242 and metal layer 243 are patterned. The layers 242, 243 are patterned similarly to the second electrodes 251, as shown in FIG. 3C. While FIG. 3C shows only layers 242, 243 patterned, layer 241 could also be patterned. The embodiment shown in FIG. 3C can be formed as described in application Ser. No. 11/111,917, filed Apr. 22, 2005 assigned to Micron Technology, Inc. and incorporated herein by reference.

As shown in FIG. 3A, the second electrodes 251 are formed as lines along the x direction. The first electrodes 212 have a pitch 208, which, for example, is the distance in the y direction from about the center of a first electrode 212b in a first row to about the center of a first electrode 212c in a neighboring row. The second electrodes 251 have a pitch 209, which is approximately the same as the pitch 208 of the first electrodes 212. The second electrodes 251 are off set by approximately one half pitch 208 (or 209) from the first electrodes 212. Accordingly, as shown in FIGS. 3A-3C, each first electrode 212 underlies a region 260 between two second electrodes 251. In the exemplary embodiment of FIGS. 3A-3C, each first electrode 212 underlies a portion of two adjacent second electrodes 251. For example, each first electrode 212 of word row n underlies a portion of the two adjacent second electrodes 251.

Although in the illustrated exemplary embodiments of the invention, stack 240 is shown including layers 241, 242, 243, it should be appreciated that one or more of layers 241, 242, 243 may be excluded and other layers may be included. Non limiting examples of materials and layers that can be included in stack 240 and materials for electrodes 212, 251 are discussed in various patents and patent applications assigned to Micron Technology, Inc., including, but not limited to the following: U.S. patent application Ser. No. 10/765,393; U.S. patent application Ser. No. 09/853,233; U.S. patent application Ser. No. 10/022,722; U.S. patent application Ser. No. 10/663,741; U.S. patent application Ser. No. 09/988,984; U.S. patent application Ser. No. 10/121,790; U.S. patent application Ser. No. 09/941,544; U.S. patent application Ser. No. 10/193,529; U.S. patent application Ser. No. 10/100,450; U.S. patent application Ser. No. 10/231,779; U.S. patent application Ser. No. 10/893,299; U.S. patent application Ser. No. 10/077,872; U.S. patent application Ser. No. 10/865,903; U.S. patent application Ser. No. 10/230,327; U.S. patent application Ser. No. 09/943,190; U.S. patent application Ser. No. 10/622,482; U.S. patent application Ser. No. 10/081,594; U.S. patent application Ser. No. 10/819,315; U.S. patent application Ser. No. 11/062,436; U.S. patent application Ser. No. 10/899,010;

and U.S. patent application Ser. No. 10/796,000, which are incorporated herein by reference.

The array 100 includes memory elements 101a, 101b, each for storing one bit of data, i.e., a logic 1 or 0. Since each first electrode 212 underlies two second electrodes 251, each first electrode 212 is associated with two memory elements 101a, 101b. Accordingly the bit density of the array 100 can be increased over prior art arrays that have a single first electrode associated with a single second electrode.

While the invention is not to be bound by any specific theory, it is believed that upon application of a conditioning voltage, metal ions from the tin-chalcogenide layer 242 form one or more conducting channels within the chalcogenide material layer 241. Specifically, applying a conditioning voltage comprises applying a potential across the memory elements 101a, 101b such that material from the tin-chalcogenide layer 242 is incorporated into the chalcogenide material layer 241, thereby forming a conducting channel through the layer 241. Movement of ions from the layer 242 into or out of that conducting channel during subsequent programming forms a conductive pathway 221a, 221b, which causes a detectible resistance change across the memory elements 201a, 201b, respectively.

Figure 4:
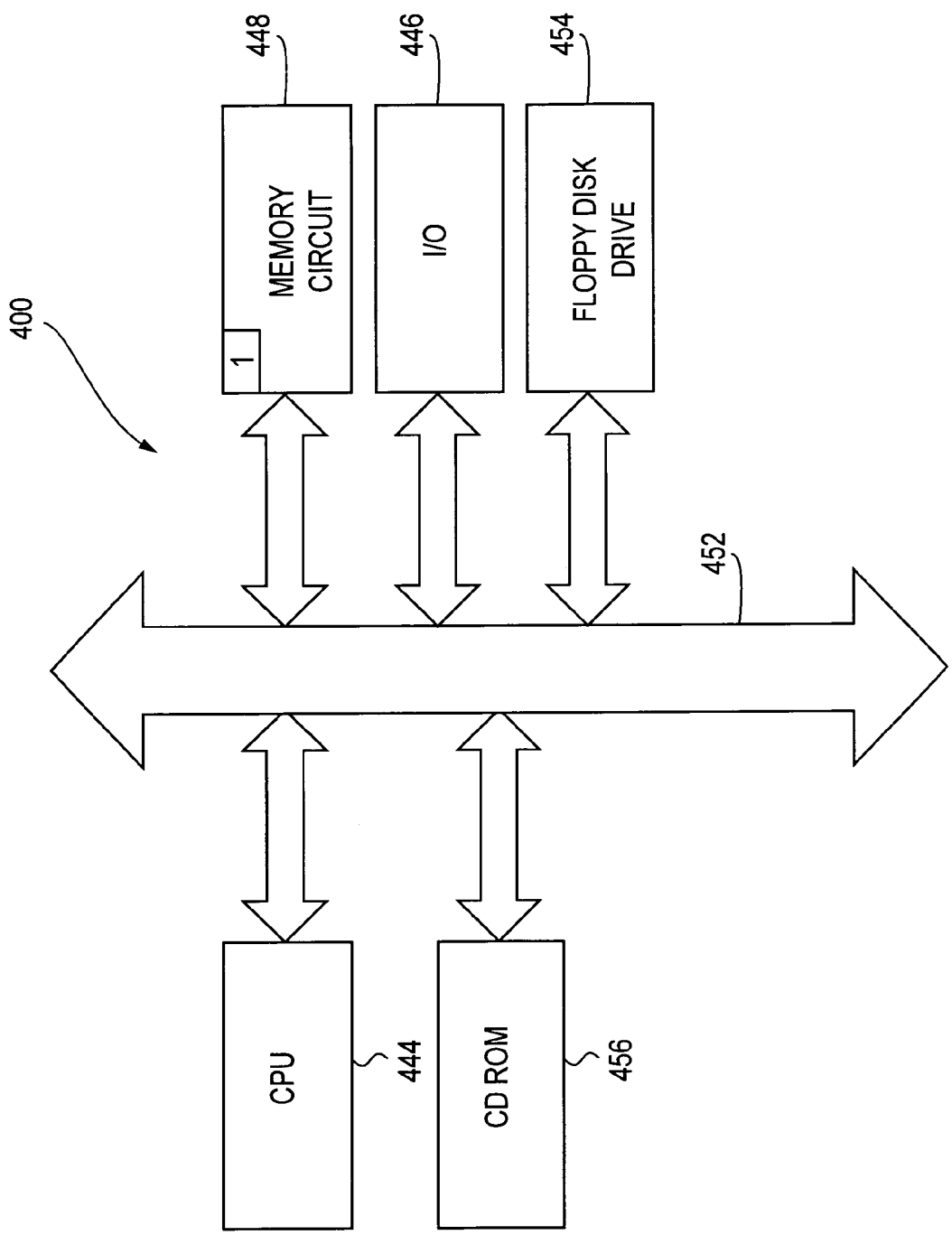
FIG. 4 is a block diagram of a system including a memory device according to an exemplary embodiment of the invention.

FIG. 4 illustrates a processor system 400 which includes a memory circuit 448, e.g., a memory device 1 (FIG. 1), which employs a memory array 100 and circuitry 102 according to the invention. The memory circuit 448 could instead include the memory device 2 (FIG. 2). The processor system 400, which can be, for example, a computer system, generally comprises a central processing unit (CPU) 444, such as a microprocessor, a digital signal processor, or other programmable digital logic devices, which communicates with an input/output (I/O) device 446 over a bus 452. The memory circuit 448 communicates with the CPU 444 over bus 452 typically through a memory controller.

In the case of a computer system, the processor system 400 may include peripheral devices such as a floppy disk drive 454 and a compact disc (CD) ROM drive 456, which also communicate with CPU 444 over the bus 452. Memory circuit 448 is preferably constructed as an integrated circuit, which includes a memory device 1. If desired, the memory circuit 448 may be combined with the processor, for example CPU 444, in a single integrated circuit.

The above description and drawings are only to be considered illustrative of exemplary embodiments, which achieve the features and advantages of the present invention. Modification and substitutions to specific process conditions and structures can be made without departing from the spirit and scope of the present invention. Accordingly, the invention is not to be considered as being limited by the foregoing description and drawings, but is only limited by the scope of the appended claims.

The invention claimed is:

1. A memory device comprising:
a first memory unit comprising at least first and second resistance variable memory elements;
a second memory unit comprising at least third and fourth resistance variable memory elements, each memory element having a first and a second electrode, the first and second memory elements having a common first electrode, the third and fourth memory elements having a common first electrode, and the second and third memory elements having a common second electrode; and
switching circuitry configured to selectively apply a voltage to first and second electrodes of at least one of the first, second, third and fourth memory elements, the switching circuitry comprising:
a first select line connected to the first memory element second electrode;
a second select line connected to the second and third memory element common second electrode;
a third select line connected to the fourth memory element second electrode;
a first a voltage supply line switchably connected to the first, second, and third select lines by first, second, and third transistors, respectively, and wherein first and third transistors are a first conductivity type and the second transistor is a second conductivity type.

2. The memory device of claim 1, wherein the first, second and third select lines are further switchably connected to the voltage supply line by first, second, and third sets of select transistors, respectively.

3. The memory device of claim 2, wherein the first, second and third transistors are connected between the first, second and third sets of select transistors, respectively, and the voltage supply line.

4. The memory device of claim 2, wherein the first, second and third sets of select transistors are connected between the first, second, and third transistors, respectively, and the voltage supply line.

5. The memory device of claim 2, wherein a gate of the second select transistor of the first set and a gate of the first select transistor of the second set are connected to a first word line, and wherein a gate of the second select transistor of the second set and a first select transistor of the third set are connected to a second word line.

6. The memory device of claim 5, wherein each set of select transistors comprising a first select transistor having first and second source/drain regions and a second select transistor having first and second source/drain regions, the first source/drain regions of the first and second select transistors being connected together and the second source/drain regions of the first and second select transistors being connected together.

7. The memory device of claim 5, wherein the first and second memory unit common first electrodes are switchably connected to a digit line.

8. The memory device of claim 7, wherein the first and second memory unit common first electrodes are switchably connected to the digit line by first and second transistors, respectively, a gate of the first transistor connected to the first word line and a gate of the second transistor connected to the second word line.

9. A memory device comprising:
a first resistance variable memory element having first and second electrodes;
a second resistance variable memory element having first and second electrodes, the first electrodes of the first and second memory elements being a common first electrode and located below the second electrodes;
a first line connected to the second electrode of the first memory element;
a second line connected to the second electrode of the second memory element; and
the first and second lines switchably connected to a third line for selectively applying a voltage to the second electrodes, wherein the first line is switchably connected to the third line by a first transistor of a first conductivity type, and wherein the second line is switchably connected to the third line by a second transistor of a second conductivity type.

10. The memory device of claim 9, wherein a gate of the first transistor and a gate of the second transistor are connected to a fourth line.

11. The memory device of claim 10, wherein the first line is further switchably connected to the third line by a first set of transistors, the first set comprising third and fourth transistors, and wherein the second line is further switchably connected to the third line by a second set of transistors, the second set comprising fifth and sixth transistors.

12. The memory device of claim 11, wherein first and second source/drain regions of the third and fourth transistors are respectively connected together, and wherein first and second source/drain regions of the fifth and sixth transistors are respectively connected together.

13. The memory device of claim 11, wherein the first transistor is connected between the third line and the first set transistors; and wherein the second transistor is connected between the third line and the second set of transistors.

14. The memory device of claim 11, wherein the first set of transistors is connected between the third line and the first transistor; and wherein the second set transistors is connected between the second transistor and the third line.

15. The memory device of claim 12, wherein gates of the fourth and fifth transistors are connected to a fourth line.

16. The memory device of claim 15, wherein the fourth line is a word line.

17. The memory device of claim 10, further comprising a seventh transistor, wherein the first electrode is connected to a first source/drain region of the seventh transistor, and wherein a gate of the seventh transistor is connected to the fourth line.

18. The memory device of claim 17, wherein a second source/drain region of the seventh transistor is connected to a fifth line.

19. A memory device comprising:
a first resistance variable memory element having first and second electrodes;
a second resistance variable memory element having first and second electrodes, the first electrodes of the first and second memory elements being a common first electrode;
first circuitry for switchably connecting a digit line to the first electrode,
a first select line connected to the second electrode of the first memory element;
a second select line connected to the second electrode of the second memory element; and
second circuitry configured to switchably connect the first and second select lines to a third line for selectively applying a first voltage to the second electrodes, the second circuitry comprising a fourth line and further configured to apply the first voltage to the first memory element second electrode upon application of a second voltage to the fourth line and to apply the first voltage to the second memory element second electrode upon application of a third voltage to the fourth line.

20. The memory device of claim 19, wherein the first circuitry comprises a transistor having a first source/drain region connected to the first electrode, a second source/drain region connected to the digit line and a gate connected to a word line.

21. The memory device of claim 20, wherein the second circuitry comprises:
a first pair of transistors, a source/drain region of each of the first pair connected to the first select line, one of the first pair having a gate connected to the word line, and a first conductivity type transistor having a gate connected to the fourth line; and
a second pair of transistors, a source/drain region of each of the second pair connected to the second select line, one of the second pair having a gate connected to the word line, and a second conductivity type transistor having a gate connected to the fourth line.

22. The memory device of claim 21, wherein the first conductivity type transistor is connected between the first pair and the third line, and wherein the second conductivity type transistor is connected between the second pair and the third line.

23. The memory device of claim 21, wherein the first pair is connected between the first conductivity type transistor and the third line, and wherein the second pair is connected between the second conductivity type transistor and the third line.

24. A processor based system comprising:
a processor; and
a memory device coupled to the processor, the memory device comprising:
a first resistance variable memory element having first and second electrodes;
a second resistance variable memory element having first and second electrodes, the first electrodes of the first and second memory elements being a common first electrode;
a first line connected to the second electrode of the first memory element;
a second line connected to the second electrode of the second memory element;
the first and second lines switchably connected to a third line for selectively applying a voltage to the second electrodes, wherein the first line is switchably connected to the third line by a first transistor of a first conductivity type, and wherein the second line is switchably connected to the third line by a second transistor of a second conductivity type.

25. The system of claim 24, wherein a gate of the first transistor and a gate of the second transistor are connected to a fourth line.

26. The system of claim 25, wherein the first line is further switchably connected to the third line by a first set of transistors, the first set comprising third and fourth transistors, and wherein the second line is further switchably connected to the third line by a second set of transistors, the second set comprising fifth and sixth transistors.

27. The system of claim 26, wherein first and second source/drain regions of the third and fourth transistors are respectively connected together, and wherein first and second source/drain regions of the fifth and sixth transistors are respectively connected together.

28. The system of claim 27, wherein the first transistor is connected between the third line and the first set of transistors; and wherein the second transistor is connected between the third line and the second set of transistors.

29. The system of claim 27, wherein the first set of transistors is connected between the third line and the first transistor; and wherein the second set of transistors is connected between the third line and the second transistor.

30. The system of claim 27, wherein gates of the fourth and fifth transistors are connected to a fourth line.

31. The system of claim 27, further comprising a seventh transistor, wherein the first electrode is connected to a first source/drain region of the seventh transistor, and wherein a gate of the seventh transistor is connected to the fourth line.

32. The system of claim 31, wherein a second source/drain region of the seventh transistor is connected to a fifth line.

33. A method of operating a memory device, the method comprising the acts of:
  operating a gate of a first transistor of a first conductivity type to allow a first voltage to be applied to a first electrode of a first resistance variable memory element; and
  operating a gate of a second transistor of a second conductivity type to allow the first voltage to be applied to a first electrode of a second memory element, wherein the first and second memory elements have a common second electrode.

34. The method of claim 33, further comprising the acts of:
  operating a gate of a third transistor when the gate of the first transistor is operated to allow the first voltage to be applied to the first electrode of the first memory element, a source/drain region of the first transistor being connected to a source/drain region of the third transistor; and
  operating a gate of a fourth transistor when the gate of the second transistor is operated to allow the first voltage to be applied to the first electrode of the second memory element, a source/drain region of the second transistor being connected to a source/drain region of the fourth transistor.

35. The method of claim 33, wherein the act of operating the gate of the first transistor comprises driving a line high, the line being connected to the gate of the first transistor and the gate of the second transistor.

36. The method of claim 33, wherein the act of operating the gate of the second transistor comprises driving the line low.

37. The method of claim 34, further comprising the act operating the gate of a fifth transistor to allow a second voltage to be applied to the second electrode.

38. The method of claim 37, wherein the gates of the third, fourth and fifth transistors are connected to a common word line, and wherein the act of operating the gates of the third, fourth and fifth transistors are a same act.

* * * * *

UNITED STATES PATENT AND TRADEMARK OFFICE
CERTIFICATE OF CORRECTION

| | | |
|---|---|---|
| PATENT NO. | : 7,269,044 B2 | Page 1 of 1 |
| APPLICATION NO. | : 11/111838 | |
| DATED | : September 11, 2007 | |
| INVENTOR(S) | : Daley | |

It is certified that error appears in the above-identified patent and that said Letters Patent is hereby corrected as shown below:

On the Title page, in field (56), under "Foreign Patent Documents", in column 2, line 2, below "JP    5-6126915    10/1981" insert -- JP    5-6126916    10/1981 --.

Signed and Sealed this

Twentieth Day of November, 2007

JON W. DUDAS
*Director of the United States Patent and Trademark Office*